(12) United States Patent
Daoud et al.

(10) Patent No.: US 7,095,624 B2
(45) Date of Patent: Aug. 22, 2006

(54) ELECTROMAGNETIC SHIELD WITH VEE-SLOT PANEL JOINTS

(75) Inventors: Bassel H. Daoud, Parsippany, NJ (US); Ivan Pawlenko, Holland, PA (US); Larry Samson, Langhorne, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 118 days.

(21) Appl. No.: 10/774,224

(22) Filed: Feb. 6, 2004

(65) Prior Publication Data

US 2005/0173782 A1    Aug. 11, 2005

(51) Int. Cl.
*H05K 9/00* (2006.01)
(52) U.S. Cl. ............... 361/800; 361/816; 361/818; 174/35 R; 174/35 GC; 29/830
(58) Field of Classification Search .......... 361/800, 361/816, 818; 174/35 R, 35 GC; 29/831
See application file for complete search history.

(56) References Cited

U.S. PATENT DOCUMENTS

| | | | | |
|---|---|---|---|---|
| 4,754,100 A * | 6/1988 | Sorensen et al. | ........... | 585/708 |
| 4,754,101 A | 6/1988 | Stickney et al. | | |
| 5,095,177 A * | 3/1992 | Johnson | ........... | 174/35 R |
| 5,175,395 A * | 12/1992 | Moore | ........... | 174/35 R |
| 5,278,351 A * | 1/1994 | Herrick | | |
| 5,354,951 A * | 10/1994 | Lange et al. | ........... | 174/35 R |
| 5,436,802 A * | 7/1995 | Trahan et al. | ........... | 361/816 |
| 5,565,656 A * | 10/1996 | Mottahed | ........... | 174/35 GC |
| 5,783,771 A * | 7/1998 | Copeland et al. | ........... | 174/35 R |
| 5,883,791 A * | 3/1999 | Deguchi | ........... | 361/818 |
| 5,917,708 A * | 6/1999 | Moran et al. | ........... | 361/800 |
| 6,194,655 B1 * | 2/2001 | Lange et al. | ........... | 174/35 GC |
| 6,313,400 B1 * | 11/2001 | Mosquera et al. | ........... | 174/35 R |
| 6,404,651 B1 * | 6/2002 | Martin et al. | ........... | 361/801 |
| 6,992,901 B1 * | 1/2006 | Hung | ........... | 361/818 |

\* cited by examiner

*Primary Examiner*—Kamand Cuneo
*Assistant Examiner*—Dameon E. Levi (57) ABSTRACT

An electromagnetic shielding structure has conductive parts for blocking propagation of electromagnetic interference, whereof at least one has an appendage or an edge configuration that is shaped so as to bite into the edge of the other of the conductive parts, such as along a narrowing groove. The appendage or edge can have a structure resembling an insulation displacement connector, but is arranged to engage the edge of a sheet-like or planar shielding element, as opposed to biting into an insulated wire. The connection achieves both electrical and mechanical connection between the parts, preferably thereby completing at least part of a shielding enclosure.

10 Claims, 3 Drawing Sheets

ELECTROMAGNETIC SHIELD WITH VEE-SLOT PANEL JOINTS

FIELD OF THE INVENTION

The invention relates to mounting panels as elements of conductive shielding enclosures. One or more conductive sheet elements of a shield is coupled mechanically and electrically to an opposed sheet element, by engagement of the edges of one or both of the sheet elements in vee-shaped slots with converging knife edges.

BACKGROUND

Some electrical and electronic circuits generate undesirable electromagnetic emissions and some circuits are adversely affected by electromagnetic emissions from other circuits. There are various causes for electromagnetic emission and for sensitivity to emissions. Current levels, conductor lengths, inductance and high frequency operation, and high slew rates (e.g., from switching inductive loads) contribute to generating electromagnetic interference or "EMI." High amplifier gains, low common mode rejection, low signal to noise ratios and other factors contribute to circuit sensitivity to incoming noise.

One technique for blocking the propagation of emissions, either incoming or outgoing, is to place a conductive barrier across the propagation path. An incident electromagnetic signal produces current in the conductive barrier, but the propagating signal is attenuated, particularly if the barrier is connected along a low resistance path to the applicable signal ground reference.

Therefore, problematic sensitive and/or high frequency circuits are often shielded by grounded conductive barriers. In one example, box-like sheet metal structures wholly or partly enclose around such circuits. In other examples, enclosures are formed of conductive polymers, or coated with conductive foils or conductive paints. The enclosures can be rigid or flexible, and can be box shaped, cylindrical, domed or otherwise shaped to define an enclosure of conductive material around the applicable circuit. It is also possible to laminate over circuit elements with a relatively close fitting conductive coating or flexible cover. However, there may be cooling interests as well as shielding interests. A conductive enclosure around a circuit can have holes or slots, or can be constructed using a conductive mesh screen. Shields having holes or slots or other openings can be effective as conductive barriers for frequencies at and below a characteristic frequency related to the size of the holes. For relatively higher frequency shielding, any holes through the shield barrier need to be relatively smaller, etc.

In connection with a printed circuit board arrangement, a rectilinear sheet metal box often is used as all or part of the shield barrier. A box can be formed by folding an integral sheet and/or attaching together two or more integral sheets so that the sheets together form a conductive barrier in the required shape of a box or cylinder or tube, etc.

Assuming the example of a rectilinear box on a printed circuit board, conductive portions of the board can define part of the barrier around a given circuit element, or barriers can be provided on opposite sides if necessary. On a given side, standing conductive walls of thin sheet metal can extend from the plane of the circuit board, e.g., extending perpendicularly upwardly from a folded flange attached to the board, or carried by one or more integral tabs that engage openings on or through the board as attachment pegs, feet, floor panel elements or the like.

The standing wall elements act as the panels of a fence defining a perimeter and keeping the EMI emissions of the circuit in or out. The panels need to be mechanically mounted to remain in position, and electrically connected to one another and to one or more points on the circuit board, typically a common ground point. Electrical and mechanical connections can be made between adjacent conductive walls. Two adjacent panels can be attached to an intervening post that provides a secure attachment to the circuit card. A full enclosure also requires a cover, e.g., parallel to and spaced from the circuit board, and also connected electrically to the walls and thereby to the circuit ground or other point of reference.

The sheet metal elements of shield enclosures are typically inexpensive thin sheet metal stampings of aluminum, stainless steel or another material. There may be instances where it is desirable, e.g., for compactness and to reduce internal enclosure dimensions, to provide a shield with a complicated shape. This could necessitate multiple metal forming steps, such as successive folds made in a sheet metal stamping operation. More often it is desirable to minimize expense by using a minimum of stamping steps, to produce a simple structure.

An exemplary simple structure could resemble the walls and lid of a shoe box, with rectilinear standing walls having a rectangular footprint, covered by a lid having downwardly turned flange edges. Some structure is needed to ensure that the lid remains fixed on the side walls. This could be accomplished by providing a snug frictional fit, but a snug fit can be demanding of precision in the shape and dimensions of the inter-fitting parts, leading to expense. Alternatively, one of the lid or walls might be provided with slots, for receiving tabs associated the other of the lid or walls. The tabs can be barbed or arranged to be passed through a slot and then twisted or bent over to form a lock. These assembly steps such as fitting and bending over tabs also generate some expense.

It would be desirable to provide a technique whereby simple shielding enclosures could be made without the need for great precision in the size and shaping of the parts, so as to minimize expense. At the same time, however, such shielding enclosures need to be mechanically tight and secure as well as providing dependable low resistance electrical connections.

Electrical connections with conductors that are enclosed by insulation in cables can be made by providing a so-called insulation displacement connector or "IDC" structure. There are several alternative IDC structures in use. The typical connector includes an insulation-piercing or slicing part that is electrically conductive, and is intended to penetrate the insulation that encloses the cable conductor(s). Additionally, some mechanical arrangements are needed to position and support the cable while applying pressure between the penetrating part and the cable, so as to cut through the insulation to the conductor. The connector is termed an insulation displacement connector because when cutting through the insulation, the conductive penetrating part displaces the insulation along its path.

One type of insulation displacement connector comprises a conductive plate portion having a vee-shaped groove opening at one edge. A wire or similar conductor with insulation thereon is forced by a mechanical clamping arrangement toward the bottom of the vee-shaped groove. As the insulated wire is forced toward the bottom of the vee-groove, the converging walls of the groove function as knife edges to displace the insulation. At some extent of progress toward the bottom of the vee-shaped groove, one of the knife edges comes into contact with the wire, and when the lateral space between the converging walls of the groove is equal to the diameter of the wire, the wire comes into contact with both of the converging walls.

It is not desirable to shear off the conductor in a guillotine fashion, which might occur from applying sufficient pressure on the wire when disposed at the apex or bottom of the vee-groove that the wire is cut through. On the other hand, it is necessary to hold the conductive wire securely in contact against the conductive edges of the groove to maintain electrical contact.

In order to reduce the need for precise positioning or limitation on the pressure applied, the space between the converging knife edge walls of the vee-groove can be extended at the bottom of the vee groove by a slot along the center line of the vee groove. The slot has parallel edges that each join to one of the converging edges leading into the bottom of the groove. The spacing between the parallel edges is just slightly smaller than the outside diameter of the wire. In this way, pressing the insulated wire toward the bottom of the vee groove causes the converging knife edges to slice through the insulation. When the wire arrives near the bottom of the vee groove, the insulation on both opposite sides of the wire has been displaced. By further forcing the wire downwardly into the slot, there is some deformation or abrasion of the wire surface, but the wire is mechanically and electrically engaged in the IDC connection.

Connection of the insulated wire and its engagement in the vee groove generally require that the longitudinal axis of the wire pass at least somewhat perpendicularly through a plane defined by the knife edges. It is possible to vary the angle from perpendicular, but only up to a point. As the angle of incidence of the wire relative to the plane of the knife edges becomes more and more acute, the tendency increases to shear off the wire. If the wire is parallel to the plane, the wire cannot engage between the knife edges.

A bare wire could be engaged in a slot that is dimensioned to engage opposite sides of the wire between parallel edges. If there is no insulation to be displaced, one might dispense with having a vee groove and converging knife edges. The wire could be moved laterally to find the entry to the slot and pressed down into a slot defined between parallel walls. Assuming that the slot width and the wire outside diameter are approximately equal, or assuming that the wire diameter is only slightly larger than the slot at rest, the result would be mechanical engagement and electrical contact.

It would be advantageous if adjacent panels that reside in parallel planes (such as a lid flange overlapping the top edge of a box wall) could be mechanically and electrically attached as easily as engaging a wire in the vee groove of an insulation displacement connector. It would also be advantageous if panels that are at right angles and meet along an edge could be mechanically and electrically attached so easily. However, such panels are not arranged so that their edges cross perpendicularly. If arranged to cross perpendicularly (for example if a depending lid flange is lengthened to protrude beyond a standing side or end wall of a box), there is a resulting gap that may detract from shielding performance.

SUMMARY OF THE INVENTION

It is an object of the invention to provide a technique for structurally configuring shielding sheet elements or assemblies or formations of sheet elements, so as to attach mechanically and electrically in a convenient, dependable and inexpensive manner.

It is another object of the invention to adapt aspects of knife edge engagements characteristic of insulation displacement connectors, to couple together sheet metal elements of electromagnetic shields.

These and other objects are met in an electromagnetic shielding structure having two or more conductive parts for blocking propagation of electromagnetic interference, whereof at least one of such conductive parts is provided with an appendage or edge configuration that is shaped so as to bite into the edge of the other of the conductive parts. The appendage or edge can have a structure resembling an insulation displacement connector, but is arranged to engage one substantially sheet-like or planar shielding element with the edge of another planar element, as opposed to joining a connector with a linear wire or similar conductor. The connection achieves both electrical and mechanical connection between the parts, preferably thereby completing at least part of a shielding enclosure.

More particularly, at least a first element elongated planar element defines an electrically conductive barrier surface, namely a conductor that is to be placed to block propagation of electromagnetic energy and is preferably grounded by conductive coupling to a circuit ground. At least a second planar element, generally oriented along the conductive barrier surface defined by the first element, continues the barrier surface against propagation of electromagnetic energy. According to an inventive aspect, at least one of the first and second elements has at least a limited length portion, oriented to cross with the barrier surface. This limited length portion has a receiving slot into which the other of said first and second elements is insertable, preferably along a path that narrows or tapers as the insertion proceeds. The receiving slot has an inside width that is nominally smaller than an outside width of said other of said first and second elements for insertion into the receiving slot. At least one of the receiving slot and the other of the first and second elements is deformed by said insertion as one bites into the other. The result is electrical and also mechanical connection.

In the preferred application of this structure to assembling parts of an electromagnetic shield, the parts can be inexpensive sheet metal or similar parts, stamped or at least partly formed as parts of a shield enclosure that are to be attached to define at least part of a barrier around a shielded volume. One of the parts has a vee groove that crosses the edge of the other, the groove tapering from a wider inlet to a slot at which the vee groove cuts slightly into the material of the edge that it crosses. Both crossing parts can be provided with tapered grooves in this manner, permitting a positioning error in two orthogonal directions of plus or minus half the width of the grooves.

BRIEF DESCRIPTION OF THE DRAWINGS

The invention can be understood from the following detailed description when read in conjunction with the accompanying drawing. It is emphasized that, according to accepted practice, the features of the drawing are not necessarily to scale and may be shown arbitrarily expanded or reduced for clarity. The same numerals are used to denote the same features throughout the specification and drawings, wherein.

DETAILED DESCRIPTION

The inventive electromagnetic shielding structure, shown in FIGS. 1–9, generally has conductive parts for blocking propagation of electromagnetic interference, such as panels forming a partly open structure. The walls of a rectilinear box and discrete panels oriented orthogonally are used as illustrative examples. In any event, at least two elements are to be mechanically and electrically coupled together. The two elements can be panels that comprise discrete members or can be parts of other structures. The two elements likewise can comprise panels as elements or connector elements that are to be mechanically and electrically coupled with other such connectors or with panel elements. A rectangular box is used as an example that is apt for many electromagnetic shielding applications. The invention is also applicable to partial enclosures and even simply walls or barriers, which are to be coupled conductively and used as shields or waveguides or similar conductive elements.

At least one such shielding structure is provided with an appendage or an edge configuration that is shaped so as to bite into the edge of the other of the conductive panels or similar parts. The appendage or edge configuration can have a tapering vee slot, preferably narrowing into a groove that has a width that forms at least an interference fit for electrical and mechanical engagement. Preferably the vee slot bites into the material of an edge of the other panel part to be fit therein, displacing, for example, a 0.001 to 0.005 inch of surface material from one or both of the slot edges and the surface material of the other panel adjacent to a free edge thereof. The appendage or biting edge configuration can have a structure resembling an insulation displacement connector, but is arranged to engage the edge of a sheet-like or planar shielding element, as opposed to biting into an insulated wire. The connection achieves both electrical and mechanical connection between the parts, preferably thereby completing at least part of a shielding enclosure.

This description of exemplary embodiments is to be read in connection with the accompanying drawings, wherein the parts are shown in certain configurations or orientations for convenience or by way of example. Therefore, relative spatial terms such as "lower," "upper," "horizontal," "vertical," "above," "below," "up," "down," "top" and "bottom" as well as derivatives thereof (e.g., "horizontally," "downwardly," "upwardly," etc.) refer to the orientation as then being described or as shown in the drawing under discussion. These terms for convenience of description do not require that the apparatus be constructed or operated in a particular orientation.

Similarly, terms found in this description concerning attachments, coupling and the like, such as "connected" and "interconnected," refer to a relationship wherein structures are secured or attached to one another either directly or indirectly through intervening structures, as well as connections that may be movable or rigid. Additionally, connection of the parts by engaging slots and edges as described should not be read as excluding additional attached parts or additional means of attachment of the engaged parts, for example by soldering after the parts have been engaged.

Figure 1:
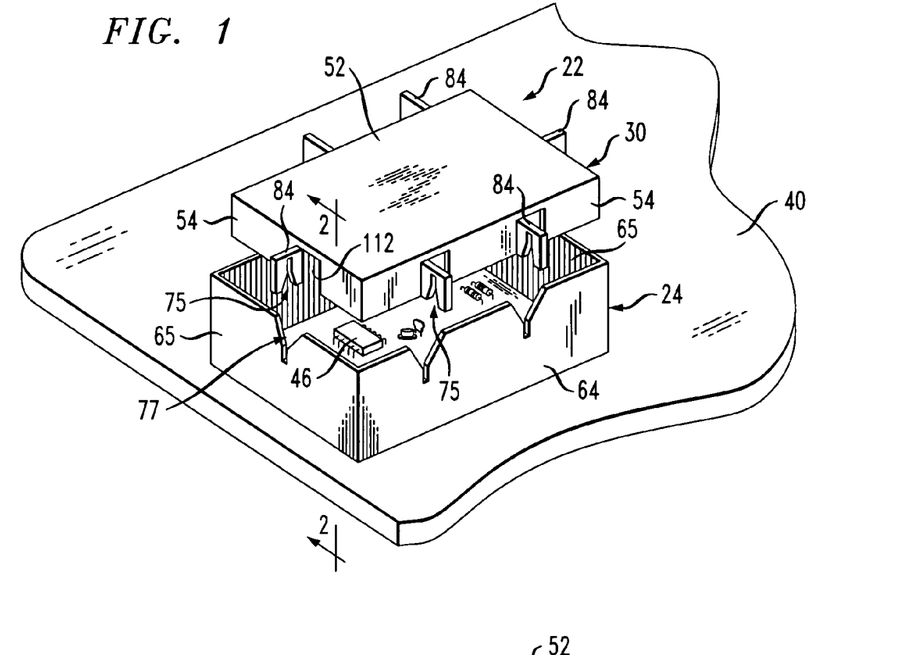
FIG. 1 is a perspective view of an embodiment of the invention, applied to a sheet metal shielding box enclosing generally depicted circuit elements, showing the shielding box in an intermediate stage of assembly, namely with the lid exploded from the side walls.

Referring to FIG. 1, an electromagnetic shielding structure 22 is shown in a partly exploded perspective view. The shielding structure shown generally is shaped as a rectilinear box 24 having standing side walls and a lid 30. The structure is mounted on a circuit card 40 such as a printed circuit board. The circuit card can define a conductive plane or the box shape can include a bottom on the same side of the circuit card or on the opposite side of the circuit card, if required. The invention is applicable to enclosures that enclose completely around a circuit element 46, and also to partial enclosures as well as simple barriers. Whether the structure is a full or partial enclosure, the point is mechanically and electrically to attach at least two conductive shielding elements that together provide the necessary structure to form an electromagnetic shield or barrier. In particular, the at least two elements are structured and configured to position at least one such shielding element across a path of electromagnetic field propagation, and also to make any necessary electrically conductive connections with the element thereby placed across the path of propagation.

The inventive structure might be used to prevent the outward propagation of the emissions of the local circuit element 46, or to protect the local circuit element 46 from receiving incoming emissions originating elsewhere. Normally shields as are employed as described to block propagation through a barrier. However a similar structure comprising two or more planar parts is also useful to direct electrical energy in a beneficial way, such as to form part of an antenna or waveguide instead of a barrier. The planar parts that are involved need not be continuous or continuously conductive in some applications, and instead can form simple barriers, or can have gaps and holes for ventilation or weight reduction, dimensioned to account for the wavelengths to be blocked or directed.

In the embodiment shown in FIG. 1, the shielding structure 22 is shown in the non-limiting shape of a box 24 having side walls, and a lid 30 to be connected to the box side walls, mechanically and electrically conductively. The shielding structure has at least one first element that is planar, the first element defining a substantial elongation or length as well as width, and defines an electrically conductive barrier surface against propagation of electromagnetic energy through said first element over a predetermined area. In the example of a box structure as shown in FIG. 1, the first element could be considered to be any of the mutually perpendicular panels that form the top panel 52 of the lid 30, the depending skirt edges 54 of the top panel, the standing side walls 64 and standing end walls 65 of the box 24 on the circuit board 40, or a bottom panel (not shown). All of these individual panels or parts form conductive barriers.

In addition to the first one of such panels or parts considered the pertinent conductive first element, the structure also has at least one second element that is also electrically conductive and planar (elongated and defining a substantial width) to be mechanically and electrically connected to the first element. The second element is generally oriented relative to the conductive barrier surface defined by the first element, for continuing or enlarging the barrier surface provided by the first element against propagation of electromagnetic energy. The first and second elements can comprise conductive sheets, such as thin sheet metal. For example, the first and second elements can be two adjacent sides of the box 24, a top and a side or bottom and side, abutting or overlapping parallel sections of the same top or side that are adjacent to one another, etc.

According to an inventive aspect, at least one of the first and second elements that are to be electrically and mechanically attached to one another (i.e., one of two abutting or overlapping or similarly adjacent parts) has at least one portion that can be of a limited length but is oriented so as to cross the plane of the other of the first and second elements. The portion of the conductive element that crosses the plane of the other conductive element, which can comprise a portion of conductive sheet such as a bent up tab, has a receiving slot 75 into which the other of said first and second elements is insertable. In one embodiment, exemplified by FIG. 1, both the portion that crosses and the crossed portion have slots 75, 77, oriented at right angles, at which the first and second elements cross and engage. The receiving slot at least for one of these engaging parts of the first and second elements has an inside width along at least a part 82 of the insertion distance that is nominally narrower than an outside width of said other of said first and second elements for insertion into the receiving slot. The smaller inside dimension of the receiving slot as compared to the outside width fitted therein produces an interference fit, i.e., causes at least one of the receiving slot and the other or outside width of the respective first and second elements to become deformed by said insertion into the receiving slot. As a result, the first and second elements are electrically and mechanically connected by said insertion.

This structure as detailed in the preceding description, has certain aspects that are similar to insulation displacement connectors, sometimes used to affix insulated conductors to connection terminals by forcing the insulated conductor into a vee-shaped slot in a knife edge formed by a connection terminal, until the knife edge bites through the insulation and makes electrically conductive contact with the conductor therein. According to an embodiment of the present invention, the knife edge is formed in one or both of the two crossing parts of the first and second elements when such elements are assembled, achieving mechanical and electrical contact sufficient to couple and continue the conductive barriers provided by one of the first and second elements, by fixing the relative position and electrically coupling the other of said elements to the first one.

Referring to FIG. 1, in the box shield structure shown, the top or lid member 30 comprises a lid panel 52 and skirts 54 depending from the lid panel to free edges facing downward in the orientation shown. The skirt edges lap over the top edges of the box perimeter standing side and end walls 64, 65, which side and end walls are mounted on the circuit board 40. The box shield structure in this case is arranged to block propagation of electromagnetic energy to or from electrical components 46 enclosed in the shield structure. The first and second elements thus comprise walls of a shielding enclosure or portions of walls.

Figure 2:
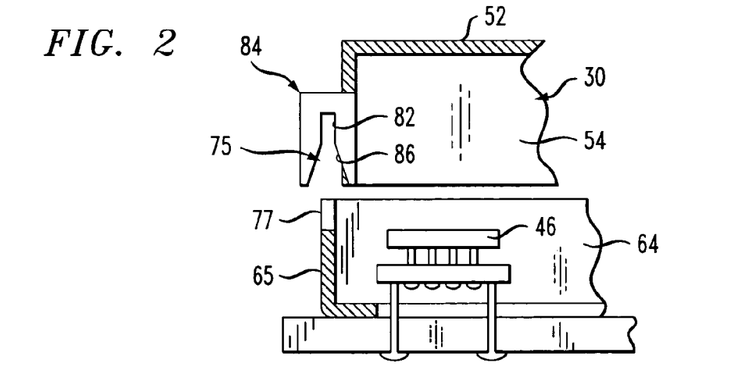
FIG. 2 is a partial section view taken along lines 2—2 in FIG. 1.
Figure 3:
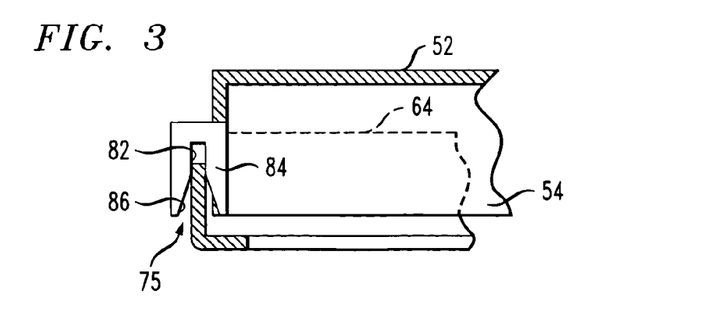
FIG. 3 is a partial section view corresponding to FIG. 2, with the lid in place and the enclosure assembled.
Figures 4, 5:
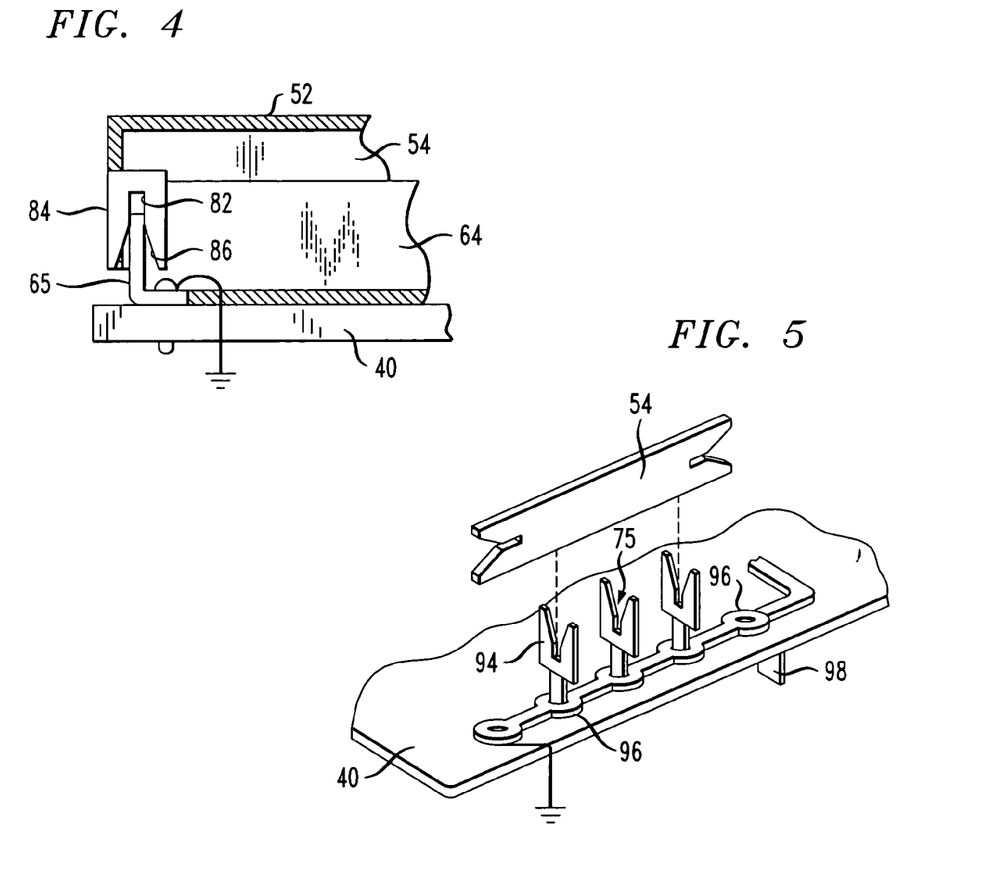
FIG. 4 is a partial section view illustrating an alternative embodiment wherein the lid connecting element is turned inwardly rather than outwardly as in FIGS. 1–3.
FIG. 5 is an exploded perspective view wherein a vee groove is defined by a series of insulation displacement wire connectors used to engage a sheet edge, and illustrating further vee groove connections for additional elements.

Certain of the walls of the shielding enclosure in FIG. 1 extend in parallel planes and overlap one another. In FIGS. 1–3, the skirts 54 of the lid member 30 are parallel to and fit inside the perimeter walls 64, 65 of the bottom part of the box shield structure. In FIG. 4, the skirt edges 54 of the lid 30 fit outside and overlap the perimeter walls 64, 65 of the bottom or box part.

In each of these examples, the portion of one planar part that crosses the plane of the other planar part is provided at least partly by a tab 84 that is integral with its adjacent skirt 54 or wall panel 64, 65 and is bent from the plane of the material adjacent to the tab 84 so as to cross the plane of said other planar part. The tab 84 is bent from the skirt 54 and engages a box wall 64, 65, or vice versa.

In FIGS. 1–4, several of the respective walls of the shielding enclosure meet along right angle edges. The portion that is oriented to cross the barrier surface (namely to cross the plane of the part to be engaged) comprises a tab 84 that is cut around two or three sides from a section of said one of the first and second elements. The tab 84 in these figures forms the portion that crosses the plane of the wall of the parallel overlapped (or under-lapped) because the tab 84 is bent from the plane of its integrally adjacent wall and that wall overlaps or under-laps the wall defining the plane to be crossed by tab 84.

The direction in which the tab 84 is bent (inwardly or outwardly) from its integral wall depends on whether the tab is integral with the lid or integral with the box perimeter walls, and then whether the skirts 54 around the lid are dimensioned to overlap around or to fit inside the box perimeter walls 64, 65. In each case the tab direction is such that the tab 84, on one of the lapped panel parts, intersects the plane of the other lapped panel part, and in this case the lapped panel parts are the skirt and perimeter walls. In FIGS. 1–3, the tab is bent outwardly from the lid skirt 54 and the lid skirts fit inside the box perimeter, whereby the tab crosses the plane of the box perimeter. In FIG. 4, the tab 84 is bent inwardly from the lid skirt 54 and the skirt fits outside the box perimeter, with the same result of crossing the plane of the box perimeter. It should be apparent that the tab could be bent from any of the box walls so as to intersect the plane of the skirt, or vice versa. It is also within the scope of the invention to have portions such as tabs on both the overlapping panel, bent inwardly, and on the under-lapping panel, bent outwardly, so that both the lid skirt walls and the box perimeter walls have structures that attached to the respective opposed walls.

Referring to FIGS. 1–3, the receiving slot 75 comprises a vee groove 86 in the tab 84, leading into an end or rear part 82 for biting into the material of the perimeter wall 64 or 65. In this embodiment, a receiving slot 77 with a vee groove and optionally also a rear part for biting into the tab 84, is provided in the perimeter wall (wall 65 in FIG. 2). The tab 84 can be pressed down onto the perimeter wall 65 (and/or vice versa) until the two opposed receiving slots 75, 77 meet and their vee grooves bottom out in one another, which state is shown in FIG. 3. It is also possible to provide a structure in which one of the two engaged parts (the tab or the perimeter wall) has a receiving slot but the other does not. One receiving slot can lead into a biting rear slot 82 as shown in FIG. 2 but the other may have a receiving slot 77 with only the converging vee groove part 86. All these arrangements are according to the invention.

An arrangement is shown in FIG. 4, wherein an inwardly bent tab has a vee groove 86 that engages the top of the perimeter wall 65 but the perimeter wall does not have a corresponding vee groove. Nevertheless, this arrangement securely attaches the parts mechanically, and also electrically as shown by the ground indication in FIG. 4.

It is advantageous to provide receiving slots 75, 77 with vee grooves 86, and preferably also interference fit slots 82, on both attached parts such as the lid and the box perimeter walls in FIG. 1. By also providing a plurality of tab slot connections around the skirt and box perimeter walls, such vee groove receiving slots have a self-positioning function. As the respective vee grooves are brought into engagement, the inserted panel is centered into position at the bottom of its receiving slot vee groove.

The mechanical centering and mechanical attachment of the lid to the perimeter walls can be separate or combined functions with the electrical coupling of the lid to the perimeter walls. In FIG. 1, there are two opposite side walls each having two tabbed connections as described, plus two opposite end walls, each having one tabbed connection. It is likewise possible, particularly in a device having a lid that fits closely onto the box perimeter walls, to rely on the structure of the lid to engage mechanically on the box perimeter walls but to lock down as well as to electrically engage by means of the vee slot structure as described. Such an arrangement may require only one or a few tabs 84, or in any event fewer tabs than an arrangement in which the mechanical coupling relies substantially on the tabs 84 as in FIG. 1.

The vee slot structure can engage over a simple straight edge of the opposed element, such as the vee slot in the tab on the skirt in FIG. 4 engaging the edge of the box perimeter wall. As shown in FIG. 5, other arrangements are also possible, for example wherein all or part of the structure for engaging a straight edge is a separate connector structure instead of one integral with a panel.

In FIG. 5, the shielding enclosure comprises at least one panel portion such as a skirt 54 affixed by connector posts 94 that are mounted to a circuit card 40. By using solder connections to printed circuit lands 96 to mount the connector posts, the skirt 54 becomes electrically coupled into a circuit node (for example grounded) and also mechanically mounted on the circuit card 40. By using soldered through-hole lands, the same circuit connections can be used for mounting one or more connector posts 94 on one side of the circuit card, and one or more additional connector posts 98 on the opposite side. In each case, the connector posts carry a portion with a receiving slot 75 analogous to the slots on the tabs 84 that are bent from a box side wall or skirt, namely forming at least a limited length portion having a vee groove that narrows to a dimension at which the groove is sufficiently narrow to provide an interference fit and/or to bite into the material of the associated panel portion. The connector posts 94 thereby position and electrically couple a conductive wall or barrier or enclosure for blocking the propagation of radiated electromagnetic energy through the air.

Figure 6:
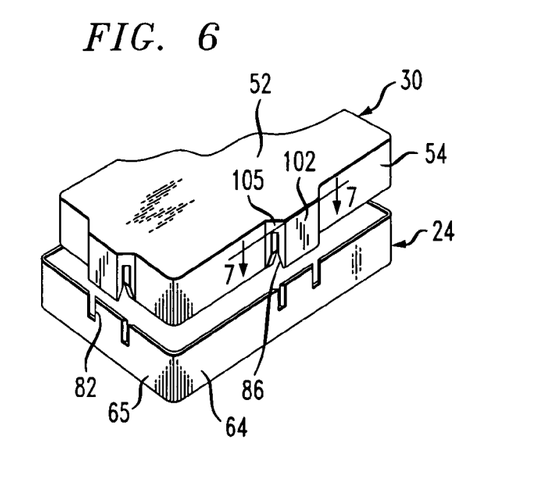
FIG. 6 is a partial perspective view showing an alternative embodiment.
Figure 7:
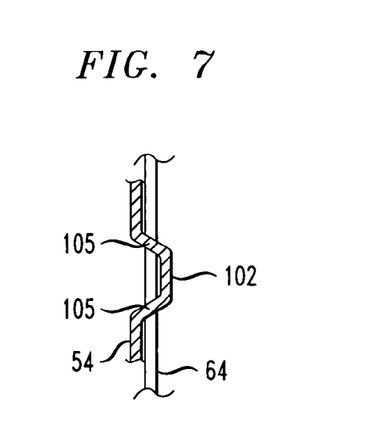
FIG. 7 is a partial section view showing the engagement of two elements as shown in FIG. 6.

In the embodiment of FIGS. 1–3, the lid skirt outside dimensions are somewhat smaller than the inside dimensions of the box perimeter walls. In FIG. 4, the lid skirt dimensions are larger than the box perimeter walls. In each case, the tab that is bent from the associated wall and has the vee groove 86, and forms a discontinuous portion that crosses over the plane of the opposed wall (64 or 65 in FIGS. 1–3) that the vee groove 86 is to engage. In FIG. 6, an embodiment is shown in which at least one of the lid 30 and the walls 64, 65 of box 24 is formed in a manner whereby a part of continuous length of panel that either contains the vee groove 86 or alternatively is to engage in vee groove 86, is bent from the general plane of that panel (the lid skirt 54 in the example shown in FIG. 6), so as to provide portions that cross the plane of the other wall (the box walls 64, 65 in the example). FIG. 7 is a partial section view showing the material of the lid skirt 54 crossing the plane of the box perimeter wall 64. The crossing parts, namely the ends of the outwardly deformed part of the lid skirt 54, have the vee grooves 86 therein.

In FIGS. 6 and 7, the portion oriented to cross the barrier surface comprises a convexity 102 on the skirt wall 54 of the lid 30. The box walls 64, 65 are flat. These parts could be reversed, namely such that the convexity 102 is in a box wall 64, 65 and the skirt wall 54 is flat. A similar result is achieved in substantially the same way by providing a concavity in the box wall or lid skirt, wherein the other of the box wall or lid skirt has a flat planar contour. A further alternative according to this aspect (not shown) can have a concavity in one wall (54 or 64/65) and a convexity in the other, wherein one or more portions containing receiving grooves, preferably a vee groove leading into an interference fit groove having parallel walls, is provided in the webs 105 at which the convexity (or concavity, depending on the point of reference), engages with the adjacent flat area of the skirt or box walls 54, 64, 65.

There are a wide variety of possible combinations of slotted parts and engaged walls possible. In the embodiments illustrated, a vee-groove tab or a separate vee groove connector or a vee groove in a part of a wall can engage either the straight edge of a panel (e.g., as in FIGS. 4 or 5) or a panel edge that also has a receiving groove as in FIGS. 1–3 and 6, which can also comprise a vee groove. In each instance of a vee groove, the apex of the converging sides of the vee groove preferably leads into a slot for achieving an interference fit.

Figure 8:
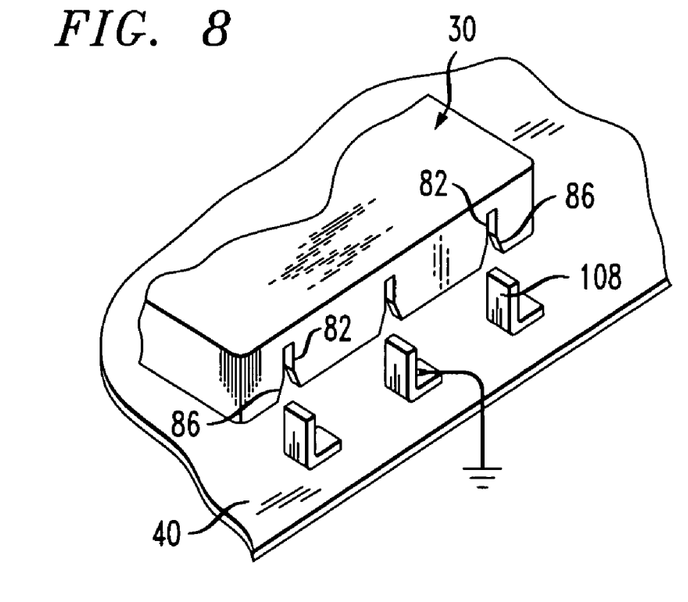
FIG. 8 is a partial perspective showing another alternative embodiment.

FIG. 8 illustrates another embodiment, namely wherein separate standing connectors such as flanged L-brackets 108, are affixed to a mounting position such as a circuit card 40, to be engaged in vee grooves 86 leading into interference fit slots 82 of a depending wall of lid 30. From these possibilities, it can be appreciated that there are several possibilities for making the parts integral with structural parts such as boxes or lids, or part of discrete wall panels that are coupleable with one another as in FIG. 5, and are subject to reversal of gender as to which of either or both of the engaged parts is slotted and which receives an edge of the other. Likewise, either or both parts may have a vee groove 86, an interference slot 82, with or without a lead-in vee groove 86, or a straight edge to be captured in a vee groove 86 and/or slot 82.

In the embodiment of FIGS. 1, both of the engaged elements (the tab and the box side wall) have vee grooves. By providing grooves (vee grooves and/or interference slots), the respective panels and portions containing the grooves and/or slots can overlap to the point at which the grooves or slots are bottomed out by the corresponding panel or portion inserted therein. If both inter-fitting panels and portions have vee grooves and slots, there is a substantial overlap possible.

Figure 9:
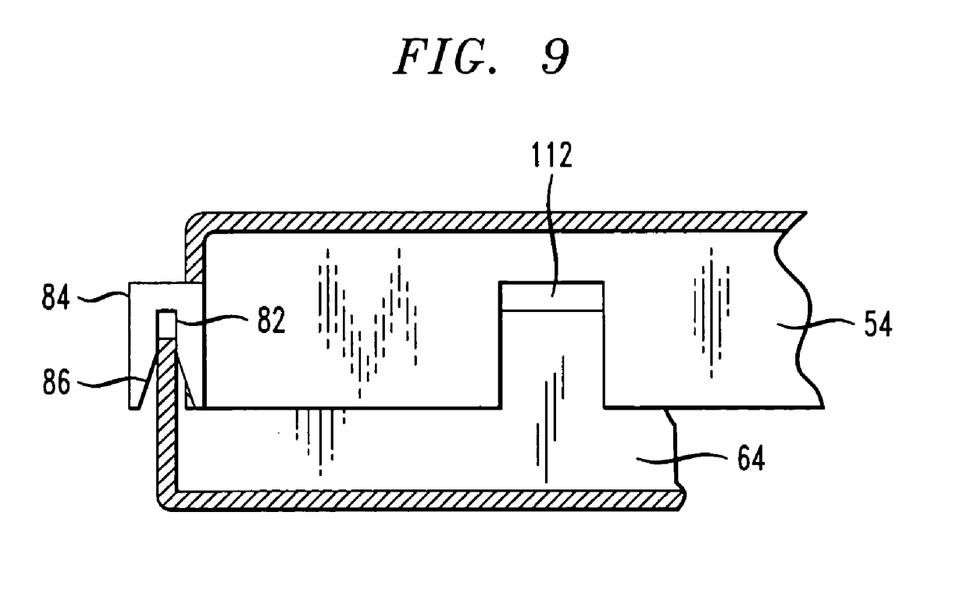
FIG. 9 is a partial section view showing the nature of the gap that remains between elements in certain of the depicted embodiments.

In FIG. 1, the vee grooves in the lid are formed in the tabs 84 that are bent outwardly from the integral skirt wall, such that there is an opening 112 left in the skirt wall 54, namely the area from which the tab 84 was cut and bent outwardly. In FIG. 9, such an opening 112 in the skirt wall can be seen from the inside of the shielding enclosure. In FIG. 9, the box wall 64 does not have a vee groove or interference slot. Therefore, the vee groove 86 and slot 82 encompass the box wall 64 up to the point at which the top edge of the box wall 64 bottoms out in the interference slot 82. The tabs 84 in which the vee grooves are formed each have a top edge that is necessarily spaced by a short distance from the extreme end of the interference slot 82. In FIG. 9 as viewed from inside the enclosure, part of the gap 112 at the opening left by bending out the tab, below the top edge of the box perimeter wall. This opening does not detract from shielding performance if the wavelengths to be shielded are long compared to the dimensions of the gap. By providing vee grooves 86 and/or interference slots 82 in the box wall 64 as well as in the tabs 84 (as shown, for example, in FIGS. 1 and 6), there is more overlap of skirt wall 54 over box side wall 64 and the vertical dimension of gap 112 can be reduced or eliminated as compared to the gap seen in FIG. 9.

The preferred edge contour of the portion receiving an opposed edge, such as the tab 84, or an associated straight panel edge, or a separate connector 108 or a convexity 102, etc., comprises a vee groove 86 opening with its widest spacing at the edge facing the opposed panel. The vee groove 86 has sides that converge at an acute angle proceeding away from that edge. The vee groove 86 leads into a slot 82 that is aligned with the center line of the vee groove and opens at the narrow end of the vee groove. The slot 82 at least partly defines a receiving slot for insertion of the opposed panel, which may or may not have a corresponding vee groove 86 and slot 82.

Preferably, the slot 82 at the end of the vee groove has parallel sides between which the opposed panel is inserted with at least an interference fit of one or a few thousands of an inch by which the slot is nominally narrower than the outside width of the opposed panel inserted therein. As a result, the panel and slot need to be forced together. Some deformation of the slot and/or panel results but the two parts become securely affixed to one another mechanically. Provided that the materials are conductive or at least contain a conductive layer or coating that becomes engaged, the parts are likely electrically coupled so as to function as parts of the same shielding enclosure.

The vee grooved portion can advantageously comprise or be shaped to resemble an insulation displacement connector, with converging knife edges and preferably an interference slot. However, instead of displacing insulation and receiving a wire conductor, the invention uses this structure to affix opposed or overlapping wall panels.

The structure of the invention can be varied as shown by the foregoing discussion. The gender and placement of the parts is subject to variation. Vee groove parts can be engaged with straight panel edges or with panels that likewise have vee grooves. The vee grooves can have interference slots in each case or only in a subset of all the engaging structures.

In view of the structural variations possible, the invention can be considered a method for electromagnetically shielding a load as opposed to the apparatus per se. The inventive method for electromagnetic shielding comprises defining at least a barrier or partial shielding enclosure around the load for blocking at least one of ingress and egress of electromagnetic energy, placing a first element 54 or 64 comprising a conductive material to provide a conductive barrier surface encompassing part of the shielding enclosure, and continuing the conductive barrier surface by placing at least one second element 64 or 54 comprising a conductive material, to encompass a further part of the shielding enclosure, wherein the second element is generally oriented along the conductive barrier surface defined by the first element. The first and second elements are crossed, over at least a portion 54, 64, 65, 84, 55, 75, 105, 108, etc., along one of the first and second elements having a receiving slot. Both can be slotted as already described. The receiving slot has an inside width that is nominally smaller than an outside width of said other of said first and second elements for insertion into the receiving slot. By inserting an edge of the other of said first and second elements into the receiving slot, which at least involves an interference fit and can involve knife edges biting into the material of the opposed element, at least one of the receiving slot and the edge inserted therein become deformed. In this way the insertion of the edge into the receiving slot mechanically attaches the first and second elements, and electrically couples the first and second elements as appropriate for shielding, achieving the objects of the invention conveniently and at very low costs.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An electromagnetic shielding structure, comprising:
at least one elongated first element defining an electrically conductive barrier surface against propagation of electromagnetic energy through said first element;
at least one second element, generally oriented along the conductive barrier surface defined by the first element, for continuing said barrier surface against propagation of electromagnetic energy;
wherein at least one of the first and second elements has at least a portion of a limited length, oriented to cross a plane of the barrier surface defined by the other of said first and second elements, said first and second elements defining crossing parts, wherein said portion has a receiving slot into which the other of said first and second elements is insertable, said receiving slot having an inside width that is nominally smaller than an outside width of said other of said first and second elements for insertion into the receiving slot, wherein at least one of said receiving slot and said other of the first and second elements is deformed by said insertion, and wherein the first and second elements are electrically and mechanically connected by said insertion.

2. The shielding structure of claim 1, wherein the first and second elements comprise walls of a shielding enclosure.

3. The shielding structure of claim 2, wherein the walls of the shielding enclosure extend in parallel planes and overlap one another.

4. The shielding structure of claim 2, wherein the walls of the shielding enclosure meet along a right angle edge.

5. The shielding structure of claim 3, wherein the portion oriented to cross the barrier surface comprises a tab cut from a section of said one of the first and second elements, said tab defining the limited length portion, wherein the tab is bent from the plane of said section so as to cross the plane of the barrier surface defined by the other of said first and second elements and wherein the receiving slot is disposed along said tab.

6. The shielding structure of claim 3, wherein the portion oriented to cross the barrier surface comprises one of a concavity and a convexity at which a section of said one of the first and second elements is deformed to provide said portion.

7. The shielding structure of claim 1, wherein the portion comprises a connector having a vee groove with converging sides leading into a slot, wherein the slot at least partly defines the receiving slot for said insertion.

8. The shielding structure of claim 1, wherein the portion has a groove leading into a slot with parallel sides, wherein the slot at least partly defines the slot for said insertion.

9. The shielding structure of claim 1, wherein the portion comprises at least one insulation displacement connector fitting having converging knife edges.

10. A method for electromagnetically shielding a load, comprising the steps of:

defining a shielding enclosure around the load for blocking at least one of ingress and egress of electromagnetic energy;

placing a first element comprising a conductive material to provide a conductive barrier surface encompassing part of the shielding enclosure;

continuing the conductive barrier surface by placing at least one second element comprising a conductive material, to encompass a further part of the shielding enclosure, wherein the second element is generally oriented along the conductive barrier surface defined by the first element;

crossing the first and second elements over at least a portion of a limited length at which one of the first and second elements has a receiving slot, wherein the receiving slot has an inside width that is nominally smaller than an outside width of said other of said first and second elements for insertion into the receiving slot;

inserting an edge of the other of said first and second elements into the receiving slot, thereby deforming at least one of said receiving slot and said edge inserted therein, wherein insertion of the edge in the receiving slot mechanically attaches and electrically couples the first and second elements.

* * * * *